United States Patent
Smith

(10) Patent No.: US 10,257,944 B2
(45) Date of Patent: Apr. 9, 2019

(54) BOARD EDGE CONNECTOR

(71) Applicant: Micron Technology, Inc., Boise, ID (US)

(72) Inventor: Kurt B. Smith, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 15/378,570

(22) Filed: Dec. 14, 2016

(65) Prior Publication Data

US 2018/0166811 A1    Jun. 14, 2018

(51) Int. Cl.
| | |
|---|---|
| *H05K 3/42* | (2006.01) |
| *H01R 12/72* | (2011.01) |
| *H05K 1/11* | (2006.01) |

(52) U.S. Cl.
CPC .......... *H05K 3/423* (2013.01); *H01R 12/721* (2013.01); *H05K 1/117* (2013.01); *H05K 1/114* (2013.01)

(58) Field of Classification Search
CPC ........ H05K 3/423; H05K 3/425; H05K 3/426; H05K 3/427; H05K 3/428; H05K 3/429
See application file for complete search history.

(56) References Cited

U.S. PATENT DOCUMENTS

| | | | |
|---|---|---|---|
| 6,884,085 B1 | 4/2005 | Goldstone | |
| 7,148,429 B2 | 12/2006 | Carswell | |
| 7,534,145 B1 | 5/2009 | Michaud et al. | |
| 7,641,518 B2 | 1/2010 | Lee et al. | |
| 8,129,272 B2 | 3/2012 | Takiar et al. | |
| 8,141,242 B2 | 3/2012 | Huang et al. | |
| 9,793,034 B2 | 10/2017 | Seok | |
| 2007/0199194 A1 | 8/2007 | Young | |
| 2010/0013074 A1 | 1/2010 | Corisis et al. | |
| 2011/0034084 A1 | 2/2011 | Hsueh et al. | |
| 2012/0115370 A1 | 5/2012 | Hsueh et al. | |
| 2013/0005190 A1 | 1/2013 | Blanchfield et al. | |
| 2014/0049265 A1 | 2/2014 | Oh | |
| 2015/0024633 A1 | 1/2015 | Chen | |
| 2015/0244119 A1 | 8/2015 | Wu et al. | |

FOREIGN PATENT DOCUMENTS

| | | |
|---|---|---|
| KR | 20160000293 A | 1/2016 |
| TW | 200906249 A | 2/2009 |

OTHER PUBLICATIONS

International Search Report and Written Opinion from related international application No. PCT/US2017/065513, dated Apr. 9, 2018, 13 pp.
Office Action from related Taiwanese patent application No. 106143308, dated Aug. 13, 2018, 16 pp.

*Primary Examiner* — Jeremy C Norris
(74) *Attorney, Agent, or Firm* — Brooks, Cameron & Huebsch PLLC

(57) ABSTRACT

Apparatuses and methods for forming serial advanced technology attachment (SATA) board edge connectors with electroplated hard gold contacts. One example method can include forming a tie bar on an inner layer of a printed circuit board (PCB), forming a trace on an outer layer of the PCB, forming a via, wherein the via electrically couples the tie bar to the trace, forming a contact coupled to the trace on the outer layer, and sending an electrical charge from the tie bar through the via and the trace to the contact to electroplate the contact.

8 Claims, 4 Drawing Sheets

BOARD EDGE CONNECTOR

TECHNICAL FIELD

The present disclosure relates generally to memory devices, and more particularly, to serial advanced technology attachment (SATA) board edge connectors.

BACKGROUND

Serial Advanced Technology Attachment (SATA) is a computer bus interface that connects host bus adapters to storage devices such as hard disk drives, optical drives, and/or solid-state drives, among other devices. SATA succeeded the older Parallel ATA (PATA) standard, offering several advantages over the older interface: reduced cable size and cost (seven conductor s instead of 40 or 80), native hot swapping, faster data transfer through higher signaling rates, and more efficient transfer through an (optional) I/O queuing protocol.

SATA host adapters and devices communicate via a high-speed serial cable over two pairs of conductors. In contrast, parallel ATA used a 16-bit wide data bus with many additional support and control signals, all operating at much lower frequency. To ensure backward compatibility with legacy ATA software and applications, SATA uses the same basic ATA and ATAPI command sets as legacy ATA devices. SATA data cables can include seven conductors (three grounds and four active data lines in two pairs) and can connect one motherboard socket to one storage device.

DETAILED DESCRIPTION

Figure 1:
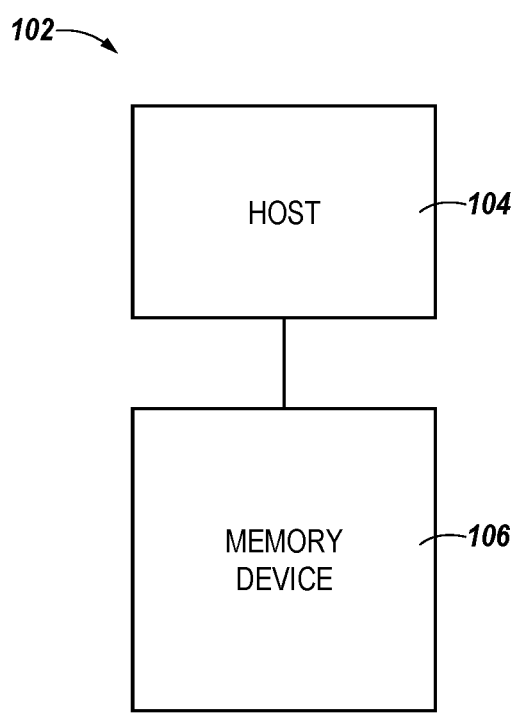
FIG. 1 is a block diagram of an apparatus in the form of a computing system including at least one memory device in accordance with a number of embodiments of the present disclosure.

Apparatuses and methods for forming serial advanced technology attachment (SATA) board edge connectors are provided in the present disclosure. In one or more embodiments, an example includes a tie bar on an inner layer of a printed circuit board (PCB), a trace on an outer layer of the PCB, and a contact on the outer layer, wherein the contact is coupled to the trace and wherein the contact is gold-plated.

One example method can include forming a tie bar on an inner layer of a PCB, forming a trace on an outer layer of the PCB, forming a via, wherein the via electrically couples the tie bar to the trace, forming a contact coupled to the trace on the outer layer, and sending an electrical charge from the tie bar through the via and the trace to the contact to electroplate the contact.

A number of embodiments of the present disclosure include a board edge connector, which can be formed on a PCB. A board edge connector, according to embodiments of the present disclosure, can have voltage signal integrity that is substantially similar to a solder down SATA connector, while reducing fabrication cost by forming the connector on the PCB.

In one or more embodiments, the board edge connector is configured to be formed on a PCB. In some embodiments, the contact of the board edge connector is a serial advanced technology attachment (SATA) contact, although other board edge connectors could be formed according to the present disclosure. In one or more embodiments, the board edge connector electrically couples a solid state drive (SSD) or a hard disk drive (HDD) to a computing system and can includes contacts that are electroplated with gold.

In previous approaches, a SATA board edge connector, which includes contacts that do not reach the edge of the PCB, could not be electroplated using tie bars without causing signal degradation due to the tie bars causing the contacts to reach an end of the board edge connector and not be the particular distance from the edge of an apparatus as defined by SATA input/output (I/O) standard. In one or more embodiments, the contacts of a board edge connector is electroplated while maintaining the particular distance from the edge of an apparatus as defined by SATA input/output (I/O) standard In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "C", "M", and "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 102 including at least one memory device 106 in accordance with a number of embodiments of the present disclosure. As used herein, a memory device 106 or a host 104 might also be separately considered an "apparatus." The memory device 106 can be a solid state drive (SSD) or a hard disk drive (HDD), for instance, and can include a host 104.

As illustrated in FIG. 1, the host 104 can be coupled to the memory device 106 via a plurality of channels and can be used to send data between the memory device 106 and the host 104. The host 104 can be in the form of a standardized interface. For example, when the memory device 106 is used for data storage in a computing system 102, the host 104 can be a serial advanced technology attachment (SATA), peripheral component interconnect express (PCIe), or a universal serial bus (USB), among other connectors and interfaces. In general, however, the host 104 can provide an interface for passing control, address, data, and other signals between the memory device 106 and the host 104 having compatible receptors for the host 104.

Host 104 can be a host system such as a personal laptop computer, a desktop computer, a digital camera, a mobile telephone, or a memory card reader, among various other types of hosts. The host 104 can include a system motherboard and/or backplane and can include a number of memory access devices (e.g., a number of processors). The host 104 can also be a memory controller for memory device 106 (e.g., having an on-die controller).

The memory device 106 can include a number of arrays of memory cells (e.g., non-volatile memory cells). The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory device 106 of computing system 102) as a page of data, for example. As such, a page of data can be referred to as a data transfer size of the memory system. Data can be sent to/from a host 104 in data segments referred to as sectors (e.g., host sectors). As such, a sector of data can be referred to as a data transfer size of the host 104.

Figure 2:
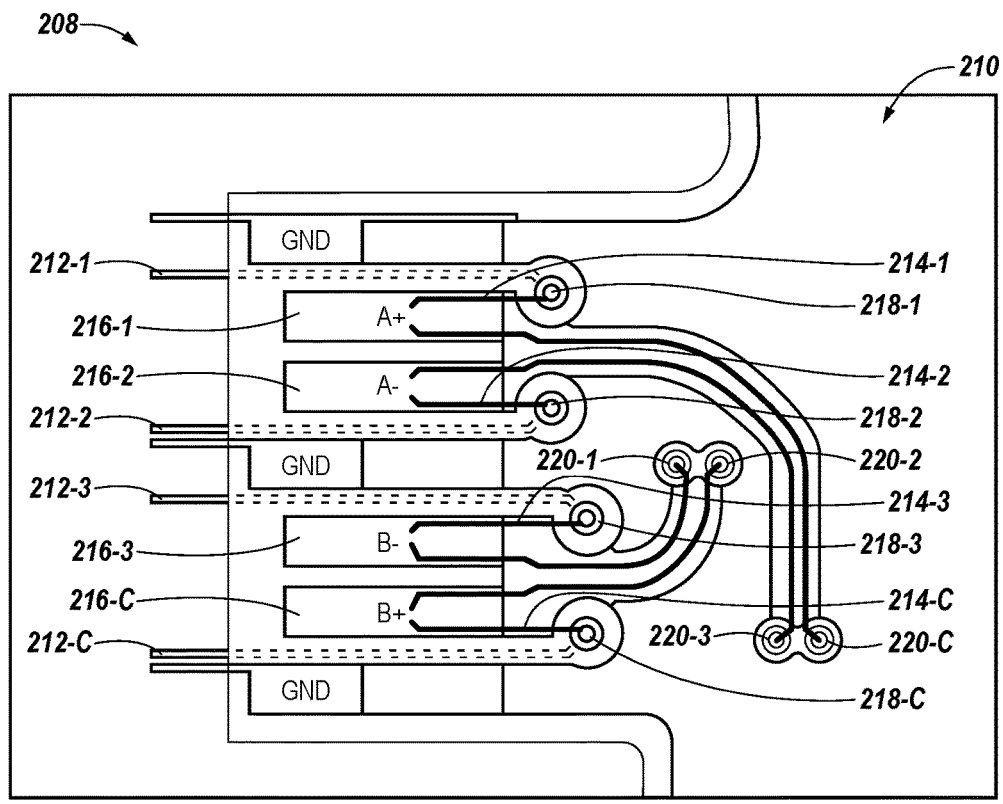
FIG. 2 illustrates a schematic diagram of a portion of a printed circuit board (PCB) including at least one board edge connector in accordance with a number of embodiments of the present disclosure.

FIG. 2 illustrates a schematic diagram of a portion of a printed circuit board (PCB) including a portion of a board edge connector in accordance with a number of embodiments of the present disclosure. The embodiment of FIG. 2 illustrates a SATA board edge connector. However, embodiments described herein are not limited to this example. As shown in FIG. 2, the SATA board edge connector 208 includes a tie bar 212 and a trace 214 electrically coupled by a via 218, a contact 216 electrically coupled to the trace 214 wherein the via 218 and trace 214 are configured to pass an electrical charge from the tie bar 212 to the contact 216. Also shown in FIG. 2, memory device via 220 coupled to contact 216. The memory device via 220 passes signals from a memory device to contact 216.

SATA board edge connector 208 can include a number of tie bars 212-1, . . . , 212-C and a number of traces 214-1, . . . , 214-C. The number of tie bars 212-1, . . . , 212-C and a number of traces 214-1, . . . , 214-C are electrically coupled by a number of vias 218-1, . . . , 218-C. The number of vias 218-1, . . . , 218-C and the number of traces 214-1, . . . , 214-C are configured to pass an electrical charge from the number of tie bars 212-1, . . . , 212-C to the number of contacts 216-1, . . . , 216-C. SATA board edge connector 208 can include a number of memory device vias 220-1, . . . , 220-C. The number of memory device vias 220-1, . . . , 220-C are configured to pass signals from one or more memory devices to a number of contacts 216-1, . . . , 216-C.

In some embodiments, via 218 is a copper structure. Also, via 218 in one or more embodiments connects an inner layer and an outer layer of the PCB. Contact 216, in one or more embodiments, is on the outer layer and the tie bar 212 is on the inner layer.

In one or more embodiments, a SATA board edge connector 208 is formed by forming tie bar 212 on an inner layer of PCB 210, forming trace 214 on an outer layer of PCB 210, forming via 218 to electrically couple tie bar 212 on the inner layer to trace 214 and contact 216 on the outer layer. An electrical charge can be sent from tie bar 212 through via 218 and trace 214 to contact 216 to electroplate contact 216. Trace 214 can be formed by etching copper coating PCB 210.

Figure 3:
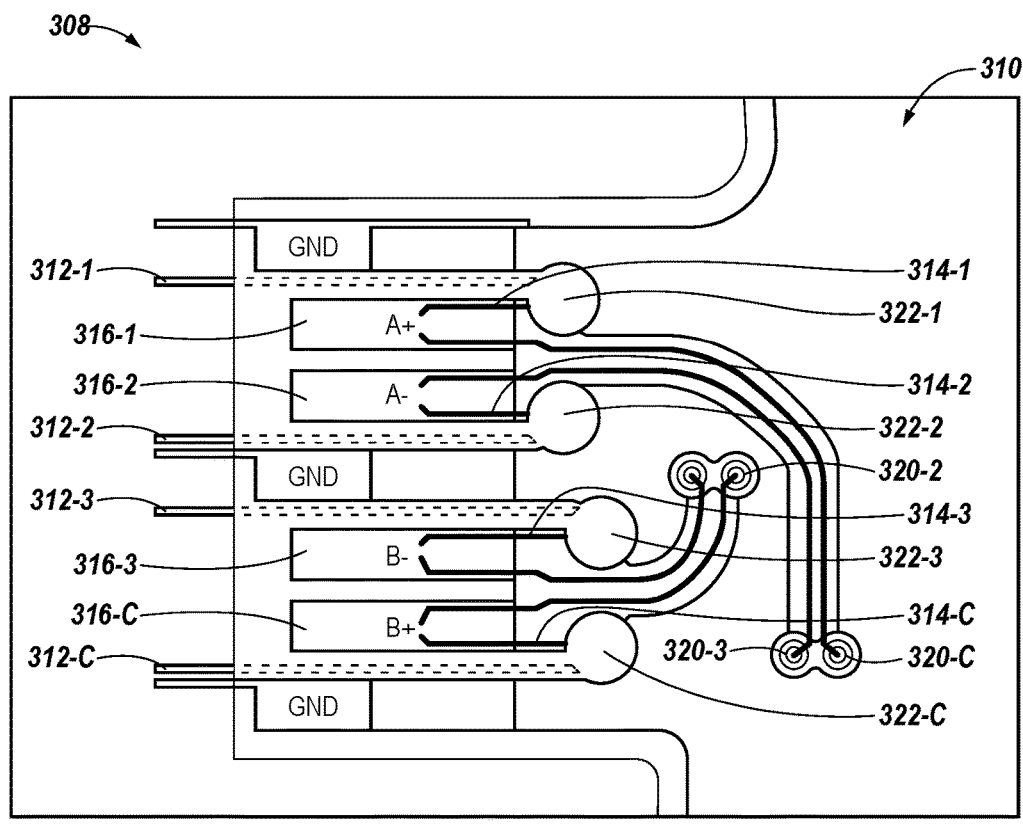
FIG. 3 illustrates a schematic diagram of a portion of a printed circuit board (PCB) including at least one board edge connector in accordance with a number of embodiments of the present disclosure.

FIG. 3 illustrates a schematic diagram of a portion of a printed circuit board (PCB) including at least one board edge connector in accordance with a number of embodiments of the present disclosure. The embodiment of FIG. 3 illustrates a SATA board edge connector. However, embodiments described herein are not limited to this example. As shown in FIG. 3, the SATA board edge connector 308 includes a tie bar 312 on an inner layer of a PCB 310, a trace 314 on an outer layer of the PCB 310, and a contact 316 on an outer layer, wherein the contact 316 is coupled to the trace 314 and wherein the contact 316 is gold-plated. Also shown in FIG. 3, memory device via 320 coupled to contact 316. The memory device via 320 passes signals from a memory device to contact 216.

SATA board edge connector 308 can include a number of tie bars 312-1, . . . , 312-C on an inner layer of a PCB 310, a number of traces 314-1, . . . , 314-C on an outer layer of the PCB, and a number of contacts 316-1, . . . , 316-C on an outer layer, wherein the number of contacts 316-1, . . . , 316-C are coupled to the number of traces 314-1, . . . , 314-C and wherein the number of contacts 316-1, . . . , 316-C are gold-plated. SATA board edge connector 308 can include a number of memory device vias 320-1, . . . , 320-C. The number of memory device vias 320-1, . . . , 320-C are configured to pass signals from one or more memory devices to a number of contacts 316-1, . . . , 316-C.

SATA board edge connector 308 can include a number of openings 322-1, . . . , 322-C. In one or more embodiments, a via (e.g. via 218 in FIG. 2) is removed after the electrical charge is passed from tie bar 312 to contact 316. The electrical charge is passed from tie bar 312 to contact 316 to electroplate contact 316. When contact 316 is connected to tie bar 312, tie bar 312 causes discontinuity in contact 316. Removing a via (e.g. via 218 in FIG. 2) electrically disconnects tie bar 312 from contact 316 therefore eliminating discontinuity and parasitic loading caused by tie bar 312 and leaves an opening 322. In some embodiments, a via (e.g. via 218 in FIG. 2) is removed by drilling to form opening 322. For example, a via (e.g. via 218 in FIG. 2), in one or more embodiments, is drilled with a larger diameter drill than the diameter of the via (e.g. via 218 in FIG. 2) to remove the electroplated coating of a via (e.g. via 218 in FIG. 2).

In one or more embodiments, a SATA board edge 308 connector is formed by forming tie bar 312 on an inner layer of PCB 310, forming trace 314 on an outer layer of PCB 310, forming via 318 to electrically couple tie bar 312 on the inner layer to trace 314 and contact 316 on the outer layer. An electrical charge can be sent from tie bar 312 through via 318 and trace 314 to contact 316 to electroplate contact 316. In some embodiments, via 318 is removed once contact 316 is electroplated.

Figure 4A:
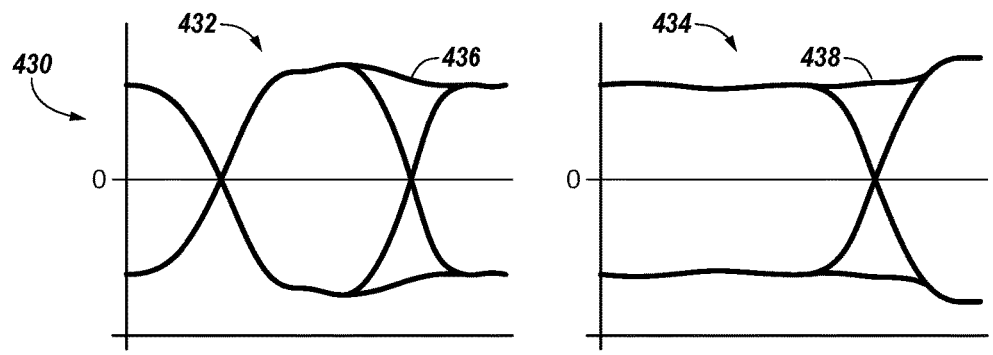
FIGS. 4A-4C illustrate graphs of signals associated with performing connector operations in accordance with a number of embodiments of the present disclosure.
Figure 4B:
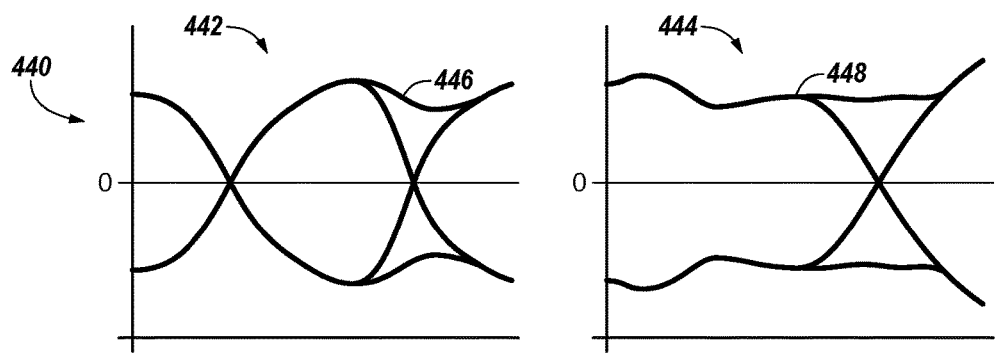
Figure 4C:
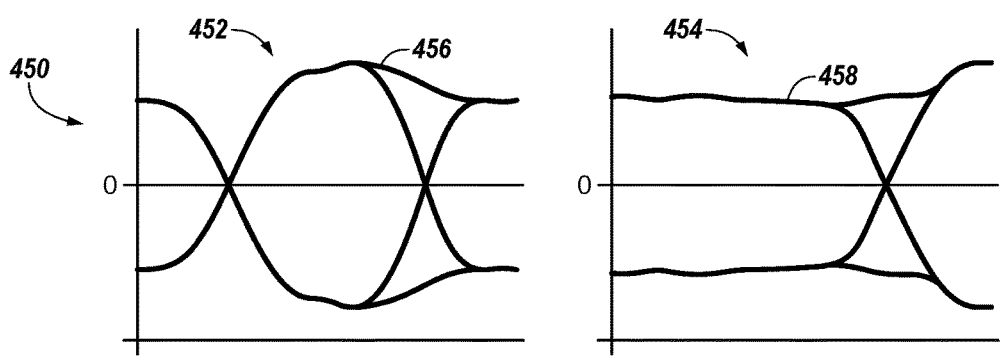

FIGS. 4A-4C illustrate graphs of signals associated with operations on a memory system. FIG. 4A illustrates graph 430 of a solder down connector. FIG. 4B illustrates graph 440 of a board edge connector before removing vias. FIG. 4C illustrates graph 450 of a board edge connector after removing vias.

Graph 430 illustrates the signal 436 during a transition 432 of the memory system that includes a solder down SATA connector. Graph 440 shows the signal 446 during a transition 442 of a board edge connector before removing vias. Graph 450 illustrates the signal 456 during a transition 452 for a board edge connector after removing the vias.

Graph 430 and graph 450 have similar signals. The signals 436 and 456 in graph 430 and graph 450 during transition 432 and 452 are more stable during transitions. Unlike graph 440 where the signal 446 during a transition 442 is less stable. When the transition is less stable this indicates degradation in the signal integrity.

Graph 430 illustrates the signal 438 after a transition 434. Graph 440 shows the signal 448 after a transition 444 of a board edge connector before removing vias. Graph 450 illustrates the signal 458 after a transition 454 for a board edge connector after removing the vias.

The signals 438 and 458 in graph 430 and graph 450 after a transition 434 and 454 have similar signals that are more stable after transitions. Unlike graph 440 where the signal 448 after a transition 444 is less stable.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
    forming a tie bar on an inner layer of a printed circuit board (PCB);
    forming a trace on an outer layer of the PCB
    forming a via, wherein the via electrically couples the tie bar to the trace;
    forming a contact coupled to the trace on the outer layer; and
    sending an electrical charge from the tie bar through the via and the trace to the contact to electroplate the contact.

2. The method of claim 1, wherein the contact is being electroplated with gold.

3. The method of claim 1, wherein the via is removed after the contact is electroplated.

4. The method of claim 3, wherein the via is removed by drilling the via.

5. The method of claim 4, wherein the drilling the via electrically disconnects the tie bar from the contact.

6. A method comprising:
    forming a tie bar on an inner layer of a printed circuit board (PCB);
    forming a trace on an outer layer of the PCB;
    forming a via, wherein the via electrically couples the tie bar to the trace;
    forming a contact coupled to the trace on the outer layer;
    sending an electrical charge from the tie bar through the via and the trace to the contact to electroplate the contact; and
    removing the via.

7. The method of claim 6, wherein the contact does not have parasitic loading.

8. The method of claim 6, wherein the trace manufacturing includes etching.

* * * * *